(12) United States Patent
Tanaka

(10) Patent No.: US 6,233,192 B1
(45) Date of Patent: May 15, 2001

(54) SEMICONDUCTOR MEMORY DEVICE

(75) Inventor: Hidehiko Tanaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/263,050

(22) Filed: Mar. 5, 1999

(30) Foreign Application Priority Data

Mar. 5, 1998 (JP) ................................................ 10-053119

(51) Int. Cl.[7] ....................................................... G11C 7/00
(52) U.S. Cl. ..................................................................... 365/222
(58) Field of Search .................................. 365/222, 233, 365/230.03, 226

(56) References Cited

U.S. PATENT DOCUMENTS

| | | | | |
|---|---|---|---|---|
| 4,967,397 | * | 10/1990 | Walck | 365/222 |
| 5,430,680 | * | 7/1995 | Parris | 365/222 |
| 5,511,033 | | 4/1996 | Jung | 365/222 |
| 5,631,871 | * | 5/1997 | Park et al. | 365/230.03 |
| 5,818,777 | * | 10/1998 | Seyyedy | 365/222 |
| 5,959,925 | * | 9/1999 | Tatsumi | 365/222 |
| 5,963,467 | * | 10/1999 | Miyatake et al. | 365/226 |
| 5,999,472 | * | 12/1999 | Sakurai | 365/222 |
| 5,999,473 | * | 12/1999 | Harrington et al. | 365/222 |
| 5,999,481 | * | 12/1999 | Cowles et al. | 365/222 |

FOREIGN PATENT DOCUMENTS

| | | |
|---|---|---|
| 07169266 | 7/1995 | (JP) . |
| 7-226077 | 8/1995 | (JP) . |
| 08077769 | 3/1996 | (JP) . |
| 09139074 | 5/1997 | (JP) . |

OTHER PUBLICATIONS

English translation of Japaneses Pat. No. 9–139074.*

* cited by examiner

Primary Examiner—Trong Phan
(74) Attorney, Agent, or Firm—Morrison & Foerster, LLP

(57) ABSTRACT

The present invention is to provide a method for designating a memory bank to be refreshed efficiently and a start and termination procedure of a self-refresh. In a dynamic RAM including a plurality of memory banks 200A, 200B, memory access actions being allowed to be independently on the respective memory banks, and a refresh control circuit for allowing the plurality of memory banks 200A, 200B to be refreshed in a lump and for allowing one memory bank 200A or 200B of the plurality of memory banks designated to be refreshed, a semiconductor memory device is configured such that when a row address input terminal or one of specific input terminals other than the row address input terminal is at a high level, the plurality of memory banks are refreshed in a lump; and when the row address input terminal or one of specific input terminals other than the row address input terminal is at a low level, one of the plurality of memory banks is designated to be refreshed in accordance with a bank selecting bit composed of one bit or a combination of a plurality of bits of row addresses other than the row address.

9 Claims, 9 Drawing Sheets

SEMICONDUCTOR MEMORY DEVICE

BACKGROUND OF THE INVENTION

1. Field of the Invention

The present invention relates to a semiconductor memory device such as a synchronous DRAM (dynamic RAM).

2. Description of the Related Art

In recent years, though various memory LSIs have been proposed in order to eliminate an access gap between a microprocessor and a memory, all of the LSIs are characterized in that input and output are performed synchronously with an external clock to increase data transfer rate. There is a memory called synchronous DRAM (hereinafter referred to as 'SDRAM') among the synchronous type memories.

The SDRAM is provided with an auto-refresh and a self-refresh as a refresh mode.

FIG. 8 is a timing chart showing an auto-refresh action of a SDRAM chip. At time t5, when a row address strobe signal /RAS and a column address strobe signal /CAS are at low levels and a write enable signal /WE and a clock enable signal CKE are at high levels, the auto-refresh is actuated. At time t6, when signals similar to those at time t5 are inputted, the auto-refresh is repeated again.

In the auto-refresh a refresh address is generated in an internal refresh counter, a row of memory cells corresponding to the refresh address is refreshed, and then the row of memory cells is automatically put in a precharged state. In order to refresh all memory cells it is usually sufficient to repeat the auto-refresh 4096 times.

FIG. 9 is a timing chart showing the self-refresh action of the SDRAM chip. At time t7, after a row address strobe signal /RAS, a column address strobe signal /CAS and a clock enable signal CKE become low and a write enable signal /WE becomes high, the self-refresh is actuated while a clock enable signal CKE is at a low level.

In the self-refresh the action similar to the auto-refresh is automatically performed at constant intervals by an internal timer.

In a refresh system standardized by JEDEC, since it has been determined that a plurality of memory banks are alternately refreshed, the respective memory banks can not be refreshed simultaneously, or concurrently with a refresh action on one of the memory banks, the other of the memory banks can not be accessed. Also, a bank to be refreshed can not be designated from the banks.

As conventional technique for providing a synchronous type DRAM having a plurality of memory banks, each memory of which is accessible independently, with a function for refreshing the plurality of memory banks simultaneously, a function for allowing one or more memory banks of the plurality of memory banks to be designated for refreshing, and a function for performing memory access concurrently with refresh action and independently therewith, thereby improving memory function, there are Japanese Unexamined Patent Publications JP-A 9-139074 (1997), JP-A 7-226077 (1995), JP-A 8-77769 (1996), JP-A 7-169266 (1996), etc.

FIG. 7 shows a block diagram of a configuration example of SDRAM disclosed in Japanese Unexamined Patent Publication JP-A 9-139074 (1997) as one of the conventional techniques.

The SDRAM of the configuration example includes a memory array 200A configuring a memory bank (BANKA) and a memory array 200B configuring a memory bank (BANKB). Each of the memory arrays 200A and 200B includes dynamic type memory cells arranged in a matrix, each of the memory cells being configured with a capacitor for storing data and a MOS transistor with a gate connected to word lines (not shown) and a drain connected to complementary bit lines (not shown).

One of the word lines (not shown) in the memory array 200A is driven to a selection level according to the decode result of a row address signal generated by a row decoder 201A. The not illustrated complementary bit lines in the memory array 200A are connected to a sense amplifier and column selecting circuit 202A. The amplifier in the sense amplifier and column selecting circuit 202A is an amplifying circuit for detecting fine voltage differences appearing in respective complementary bit lines by reading data from the memory cells to amplify the fine voltage differences. The column switching circuit in the sense amplifier and column selecting circuit 202A is a switching circuit for selecting the complementary bit lines individually to connect the selected complementary bit line to a common bit line 204. The column switching circuit performs a selecting action according to a decode result of a column address signal generated by a column decoder 203A.

On the memory array 200B side, similarly, a row decoder 201B, a sense amplifier and column selecting circuit 202B and a column decoder 203B are provided.

The complementary common bit line 204 is connected to an output terminal of an input buffer 210 and an input terminal of an output buffer 211. An input terminal of the input buffer 210 and an output terminal of the output buffer 211 are connected to 8 bit data input/output terminals I/O 0 to I/O 7.

Row address signals and column address signals supplied from the address input terminals A0 to A11 are taken in a column address buffer 205 and a row address buffer 206 in address multiplex forms. The address signals supplied are held in the respective buffers. The row address buffer 206 takes in a refresh address signal output from a refresh counter 208 as a row address signal in a refresh action mode. Output of the column address buffer 205 is supplied as preset data for a column address counter 207, and the column address counter 207 outputs column address signals serving as the preset data or values produced by sequentially incrementing the output column address signals towards the column decoders 203A, 203B in accordance with an action mode specified by a command.

A control circuit 212, which is not limited, is one of a type to which external control signals such as clock signal CLK, clock enable signal CKE, chip selecting signal /CS, column address strobe signal /CAS, row address strobe signal /RAS, write enable signal /WE, data input/output mask control signal DQM (not shown), etc. and control data from the address input terminals A0 to A11 are supplied to produce internal timing signals for controlling action mode of the SDRAM and action of the circuit block based upon variations of levels, etc. of these signals. For this reason, the control circuit 212 is provided with a control logic (not shown) and a mode register 30. It is to be noted that the symbol '/' represents a low enable signal.

The clock signal CLK serves as a master clock for the SDRAM and the other external input signals are latched synchronously with a rising edge of the internal clock signal CLK. The chip selecting signal /CS instructs start of command input cycle by the low level. The respective signals /RAS, /CAS and /WE are signals different in function from corresponding signals of a normal DRAM and used when command cycle is set.

The clock enable signal CKE is a signal for indicating validity of the next clock signal, wherein it is determined that the rising edge of the next clock signal CLK is valid when the signal CKE is at a high level, while it is determined that the rising edge is invalid when the signal CKE is at a low level. Further, in a read mode not shown, an external control signal for controlling output enable on an output buffer 211 is supplied to the control circuit 212 and, when the signal is, for example, at a high level, the output buffer 211 is put in a high impedance state.

The row address signal is defined by levels of the address input terminals A01 to A10 in bank active command cycle synchronized with the rising edge of the clock signal CLK (internal clock signal). An input from the address input terminal A11 is regarded as a bank selecting signal in the bank active command cycle. That is, when the input of the terminal A11 is at a low level, the memory bank BANKA is selected and when the input is at a high level, the memory bank BANKB is selected. A selection control for the memory bank, which is not limited particularly, can be performed by such a processing as activation of only the row decoder at the selected memory bank side, all non-selection of the column switching circuit at non-selected memory bank side, connection to only the input buffer 210 and the output buffer 211 at the selected memory bank side, etc.

An input of the terminal A10 in a precharge command cycle indicates an aspect of a precharge action to the complementary bit lines or the like, wherein a high level of the input indicates that both the memory banks are subjects to be precharged and a low level of the input indicates that one memory bank indicated by the terminal A11 is a subject to be precharged.

The column address signal is defined by levels of the terminals A0 to A8 in read command or write command (column address read command and column address write command described later) cycle. The column address thus defined serves as a start address for burst access.

The SDRAM is provided with the following two refresh commands.

(1) Refresh command 1

This command is a command required for starting an auto-refresh and is indicated by /CS, /RAS, /CAS=low level, and /WE, CKE=high level. In the auto-refresh command, the two memory arrays 200A and 200B (memory banks A and B) are refreshed simultaneously in a lump.

(2) Refresh command 2

This command is a command required for starting an auto-refresh at each memory bank and is indicated in a manner different from the command 1 by, for example, /CS, /RAS, /CAS=low level, and /WE, CKE=low level. In the auto-refresh command, a specific bit in the mode register 30 is referred to. For example, when the specific bit is 0, the memory array 200A is refreshed, and when the specific bit is 1, the memory array 200B is refreshed. Besides, for example, when the signal DQM is at a low level, the memory array 200A is refreshed and when the signal DQM is at a high level, the memory array 200B is refreshed.

In FIG. 7, only address selection in the row system is performed in the refresh action. Namely, when an address signal generated from the refresh counter 208 is taken in the row address buffer 206 instead of the address signal from the external and when the refresh command 1 is inputted, selecting actions of the word lines of the memory arrays 200A and 200B and an amplifying action of the sense amplifier are performed. Namely, memory information of dynamic type memory cells connected to the selected word lines in the two memory arrays 200A and 200B is sensed and amplified to be rewritten in the original memory cells (refresh). Alternatively, when the refresh command 2 is inputted, selecting action of the word lines of one of the memory arrays 200A and 200B and an amplifying action of the sense amplifier are effected.

In the refresh command 2, for example, when a refresh action is performed on the memory array 200A (memory bank A), read/write can be conducted by another command in the other memory array 200B (memory bank B). For example, in the burst mode, the selection action for the word lines has been conducted in the memory array 200B (memory bank B) and the read/write is carried out according to the address formed by a built-in column address counter 207.

The refresh action of the plurality of memory banks in a lump and the refresh action of one or more memory banks designated of the plurality of memory banks are performed by a command specified by a combination of control signals so that the refresh actions can be made convenient in accordance with an interface of the synchronous DRAM.

A designation of the memory bank to be refreshed is performed by referring to designation information of the memory bank stored in advance in the register according to a refresh command produced by a combination of control signals so that refresh actions of various combinations can be implemented by simple configuration.

As described, when an access action such as read/write, etc. is being performed, an auto-refresh or self-refresh can be effected in another memory bank. However, the designation of the memory bank to be auto-refreshed must be conducted by setting the mode register 30. Also, the designation of the memory bank to be self-refreshed and a termination procedure of the self-refresh are not shown.

SUMMARY OF THE INVENTION

Accordingly, an object of the present invention is to provide a method for designating a memory bank to be refreshed efficiently and a start and termination procedure of a self-refresh.

The present invention provides a semiconductor memory device comprising a plurality of memory banks, memory access actions being allowed to be independently performed on the respective memory banks, and a refresh control circuit for allowing the plurality of memory banks to be refreshed in a lump and for allowing one or more memory banks of the plurality of memory banks designated to be refreshed, the semiconductor memory device being a dynamic random access memory, wherein when a specific input terminal is at a first level, the plurality of memory banks are refreshed in a lump, and when the specific input terminal is at a second level, one of the plurality of memory banks is designated to be refreshed in accordance with a bank selecting bit composed of one bit or a combination of a plurality of bits inputted from terminals other than the specific input terminal.

More specifically, the present invention provides a semiconductor memory device comprising a plurality of memory banks, memory access actions being allowed to be independently performed on the respective memory banks, and a refresh control circuit for allowing the plurality of memory banks to be refreshed in a lump and for allowing one or more memory banks of the plurality of memory banks designated to be refreshed, the semiconductor memory device being a dynamic random access memory, wherein when one of a row address input terminal and a specific input terminal other than the row address input terminal is at a high level, the plurality of memory banks are refreshed in a lump, and when one of the row address input terminal and the specific input terminal is at a low level, one of the plurality of memory banks is designated to be refreshed in accordance with a bank selecting bit composed of one bit or a combination of a plurality of bits of row addresses other than the row address.

According to the semiconductor memory device of the invention, for example, in a 16 M synchronous DRAM, when a chip selecting signal /CS, a row address strobe signal /RAS and a column address strobe signal /CAS are at low levels, and a write enable signal /WE and a clock enable signal CKE are at high levels, the signals and an address input signal are decoded in the refresh control circuit, so that an auto-refresh is performed on one row of each bank. When the terminal A10 is at a high level, both two banks are refreshed, and when the terminal A10 is at a low level, only a bank selected by the terminal A11 is refreshed. Namely, when the terminal A11 is at a low level, the bank A is refreshed and when the terminal A11 is at a high level, the bank B is refreshed.

Also, when the chip selecting signal /CS, the row address strobe signal /RAS, the column address strobe signal /CAS and the clock enable signal CKE become low and the write enable signal /WE is at a high level, the signals and the address input signal are decoded in the refresh control circuit, so that a self-refresh is performed on each bank. When the terminal A10 is at a high level, both of two banks are self-refreshed, and when the terminal A10 is at a low level, only a bank selected by the terminal A11 is self-refreshed. Namely, when the terminal A11 is at a low level, the bank A is self-refreshed and when the terminal A11 is at a high level, the bank B is self-refreshed.

As described above, according to the invention, it is unnecessary to set a bank to be auto-refreshed by setting the mode register, so that the designated bank can be auto-refreshed only by inputting an auto-refresh command, which is much efficient.

Also, a self-refresh start command including designation of a bank to be self-refreshed and a self-refresh end command including a designation of a bank, the self-refresh of which is to be terminated, are supplied so that a more flexible self-refresh action can be implemented as compared with the conventional art.

Further, according to the invention, it is possible to perform each of the refresh actions in one cycle.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
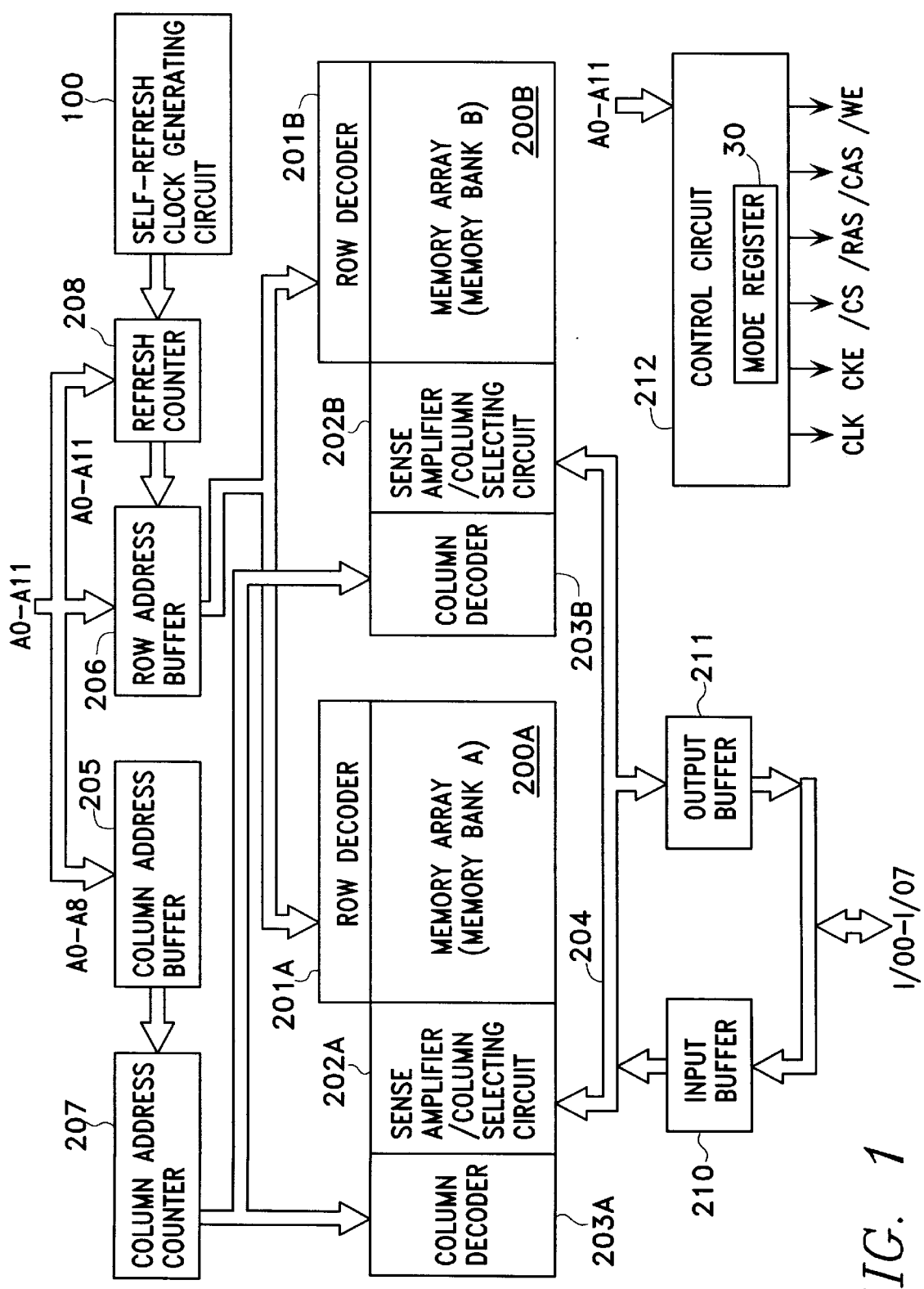
FIG. 1 is a block diagram showing an embodiment of a synchronous DRAM (SDRAM) to which the present invention is applied.

Now referring to the drawings, preferred embodiments of the invention are described below.

FIG. 1 is a block diagram of a basic configuration of a synchronous DRAM in the present invention. A self-refresh clock generating circuit 100 is added to the synchronous DRAM.

Figure 2:
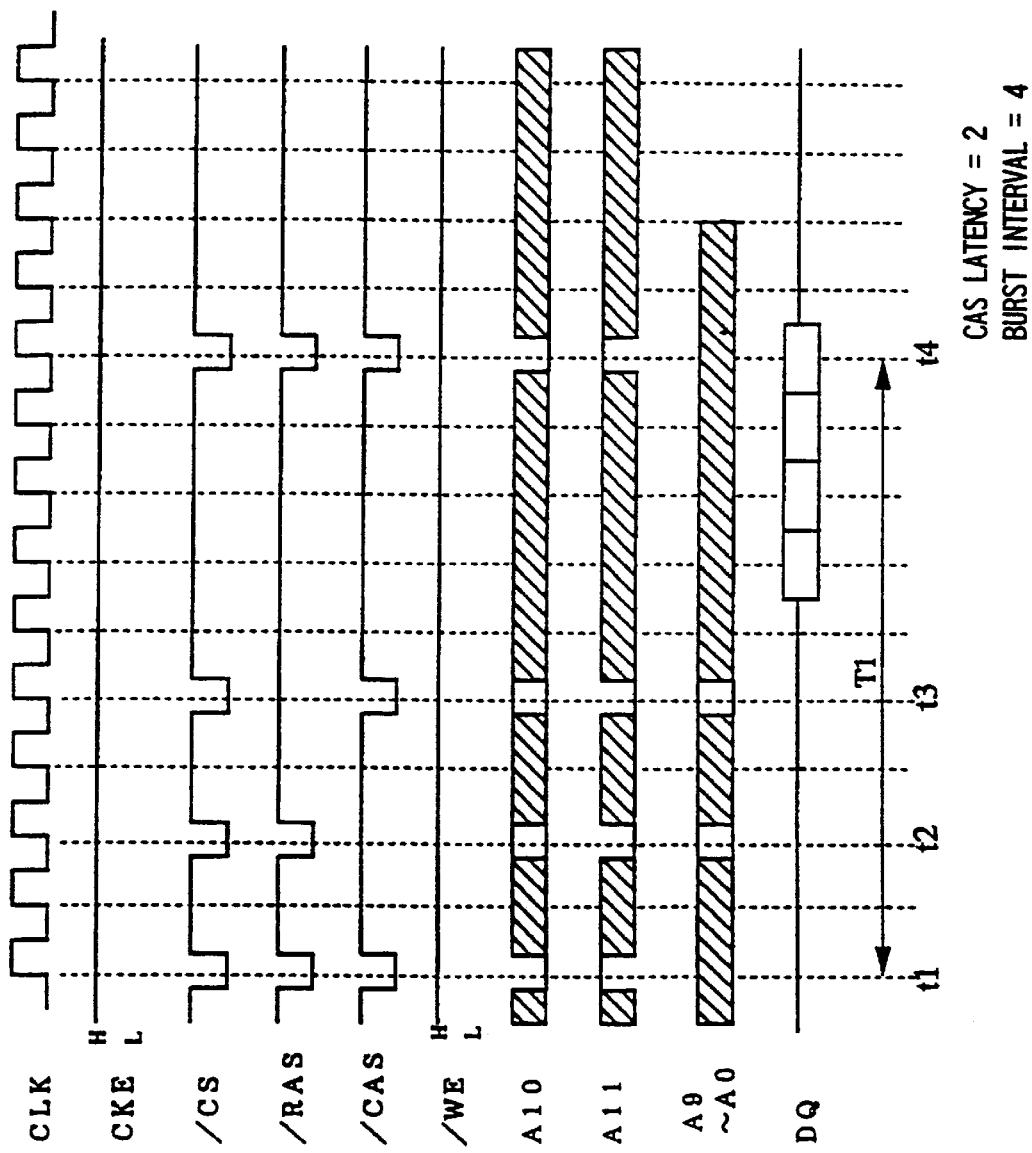
FIG. 2 is a timing chart for explaining one example of auto-refresh cycle of the SDRAM to which the invention is applied.

FIG. 2 is a timing chart showing an auto-refresh action of a 16 M synchronous DRAM in the invention.

At time t1, a chip selecting signal /CS, a row address strobe signal /RAS and a column address strobe signal /CAS are at low levels and a write enable signal /WE and a clock enable signal CKE are at high levels, which is similar to a conventional JEDEC standard. The above signals and an address input signal are decoded in the control circuit 211 and a refresh action is performed on a row of memory cells in each bank. When the terminal A10 is at a high level, both of two banks are refreshed. When the terminal A10 is at a low level, only the bank selected by the terminal A11 is refreshed. Namely, when the terminal A11 is at a low level, the bank A is refreshed, and when the terminal A11 is at a high level, the bank B is refreshed.

In FIG. 2, at time t1 since the terminal A10 is at a low level and the terminal A11 is at a high level, the bank B is refreshed. Also, at time t4, the terminal A10 is at a low level and the terminal A11 is at a high level, so that the bank B can be refreshed. Here, an interval between the time t1 and the time t4 is a time interval required during auto-refresh action, and the time interval must be at least tRC (a minimum delay time from a rise time of /RAS to a fall time of /CAS).

In the invention, concurrently with the above action, at time t2, the row address strobe signal /RAS is set at a low level, the column address strobe signal /CAS is set at a high level and the terminal A11 is set at a low level, and at time t3, the row address strobe signal /RAS is set at a high level, the column address strobe signal /CAS is set at a low level and the terminal A11 is set at a low level, so that a read (reading-in) action can be performed on the column addresses in the bank A by inputting necessary column addresses A10 to A0. It is to be noted that at time t4 shown in FIG. 2, simultaneously with output of read data of the bank A from the terminal DQ, an auto-refresh command of the bank B is inputted.

Figure 3:
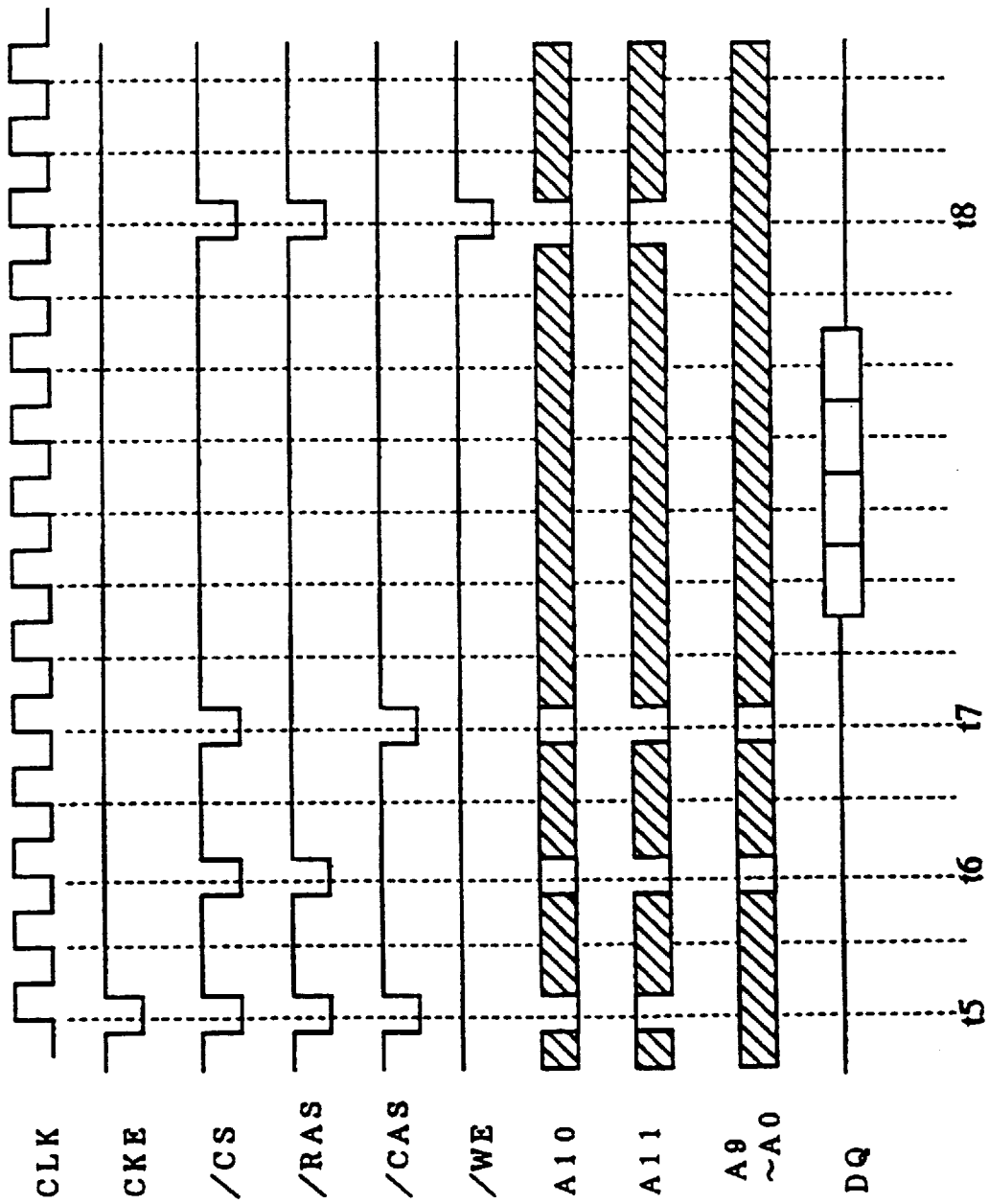
FIG. 3 is a timing chart for explaining one example of self-refresh cycle of the SDRAM to which the invention is applied.

FIG. 3 is a timing chart showing a self-refresh action of the 16 M synchronous DRAM in the invention.

At time t5, the chip selecting signal /CS, the row address strobe signal /RAS, the column address strobe signal /CAS and the clock enable signal CKE become low, and the write enable signal /WE becomes high, so that the self-refresh is actuated, which is similar to JEDEC standard. The above signals and address signal are decoded in the control circuit 212 and the self-refresh is performed on each bank. When the terminal A10 is at a high level, both the two banks are self-refreshed. When the terminal A10 is at a low level, only the bank selected by the terminal A11 is self-refreshed. That is, when the terminal A11 is at a low level, the bank A is self-refreshed, and when the terminal A11 is at a high level, the bank B is self-refreshed. The refresh counter 208 is incremented for each refresh clock cycle from the self-refresh clock generating circuit 100, so that row address corresponding to each bank is refreshed.

Also, in JEDEC standard, the clock enable signal CKE must be held at a low level during a self-refresh, but in the invention it is unnecessary to hold the clock enable signal CKE. Of course, it is possible to hold CKE at a low level to shift a power down mode. However, in this case, it is impossible to input a command into both of the banks A, B.

In FIG. 3, at time t5, since the terminal A10 is at a low level and the terminal A11 is at a high level, the bank B is self-refreshed. In the invention, concurrently with this action, at time t6, the clock enable signal /CKE becomes high, the row address strobe signal /RAS is set at a low level, the column address strobe signal /CAS is set at a high level and the terminal A11 is set at a low level, so that any one row address is made active by inputting necessary row address A10 to A0, and at time t7, the clock enable signal CKE is set at a high level, the row address strobe signal /RAS is set at a high level, the column address strobe signal /CAS is set at a low level and the terminal A11 is set at a low level, so that a reading action is performed on some column address in the bank A by inputting necessary column addresses A9 to A0.

A procedure for terminating the self-refresh action is as follows:

Similarly with the bank precharge command, the clock enable signal CKE and the column address strobe signal /CAS are set at high levels, the chip selecting signal /CS, the row address strobe signal /RAS, the write enable signal /WE and the terminal A10 are set at low levels, and the terminal A11 is set at a level showing the bank which is being self-refreshed. In the FIG. 3, the terminal A11 is set at a high level, so that the self-refresh of the bank B is terminated.

Besides this, a procedure for terminating the self-refresh can be implemented in the following manner. Explanation is made with reference to FIGS. 4 to 6.

Figure 4:
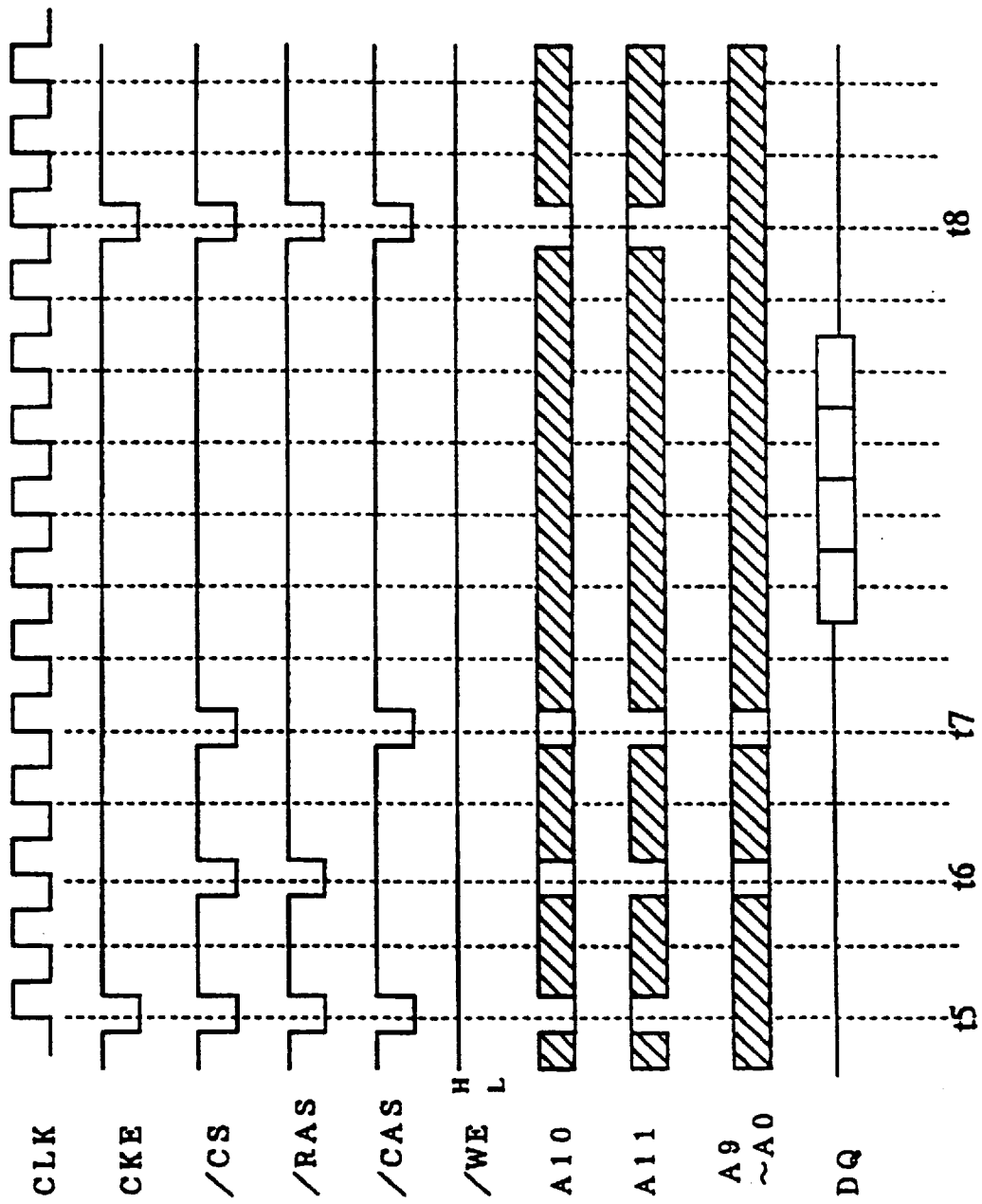
FIG. 4 is a timing chart for explaining another example of self-refresh cycle of the SDRAM to which the invention is applied.

In FIG. 4, similarly with the start of the self-refresh, the chip selecting signal /CS, the row address strobe signal /RAS, the column address strobe signal /CAS and the clock enable signal CKE become low, the write enable signal WE is set at a high level, the terminal A10 is set at a low level, and the terminal A11 is set at a level showing the bank which is being self-refreshed.

A procedure for terminating the self-refresh is as follows:

At time t8, the clock enable signal CKE, the chip selecting signal /CS, the row address strobe signal /RAS and the column address strobe signal /CAS are set at low levels, the write enable signal WE is set at a high level, the terminal A10 is set at a low level, and the terminal A11 is set at a level showing the bank which is being self-refreshed. In FIG. 4, the terminal A11 is set at a high level so that the self-refresh of the bank B is terminated.

Figure 5:
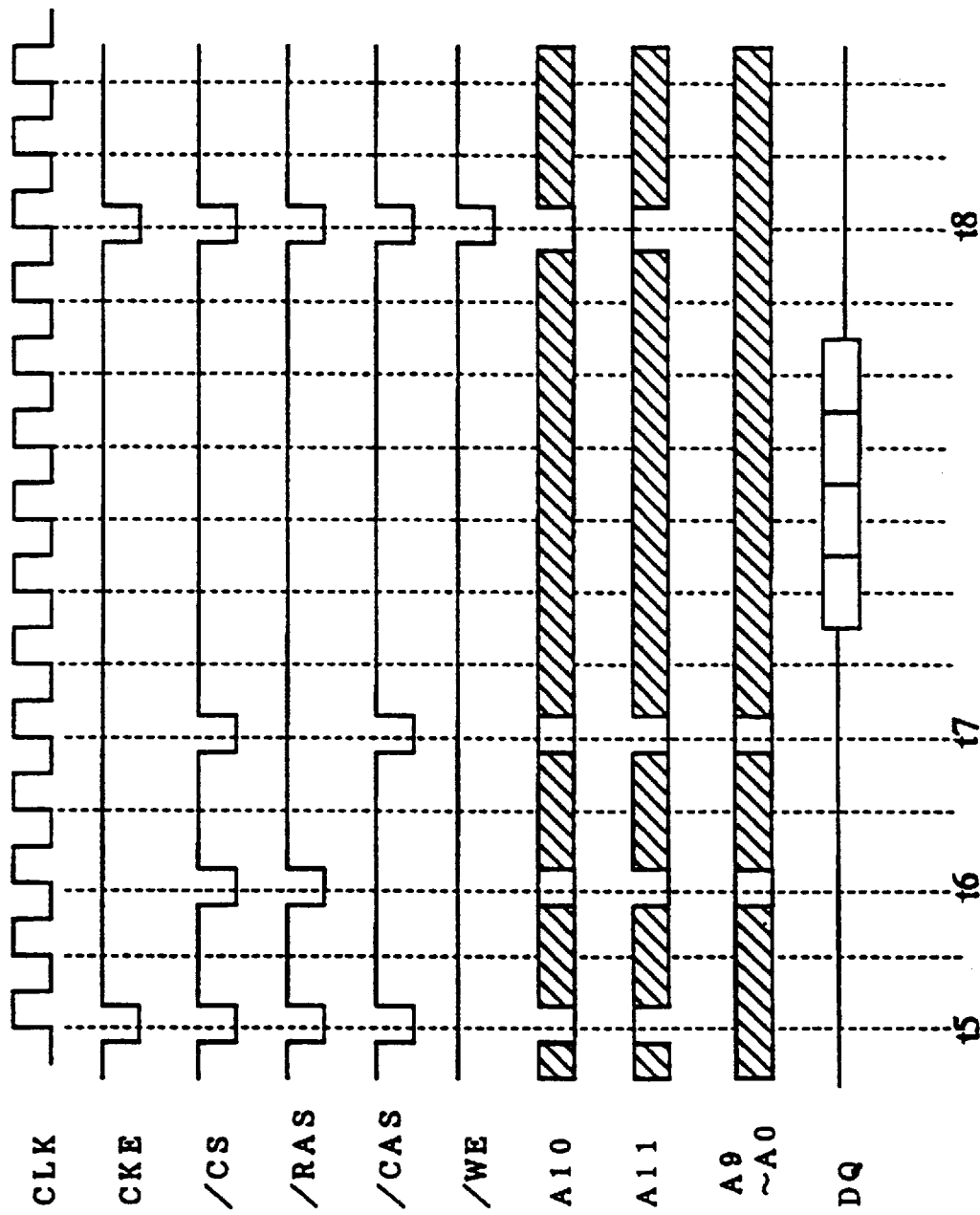
FIG. 5 is a timing chart for explaining still another example of self-refresh cycle of the SDRAM to which the invention is applied.

At time t8 in FIG. 5, similarly with the mode register setting command, the chip selecting signal /CS, the row address strobe signal /RAS, the column address strobe signal /CAS, the clock enable signal CKE and the write enable signal /WE are set at low levels, the terminal A10 is set at a low level, and the terminal A11 is set at a level showing the bank which is being self-refreshed. In FIG. 5, the terminal A11 is set at a high level, so that the self-refresh of the bank B is terminated.

Figure 6:
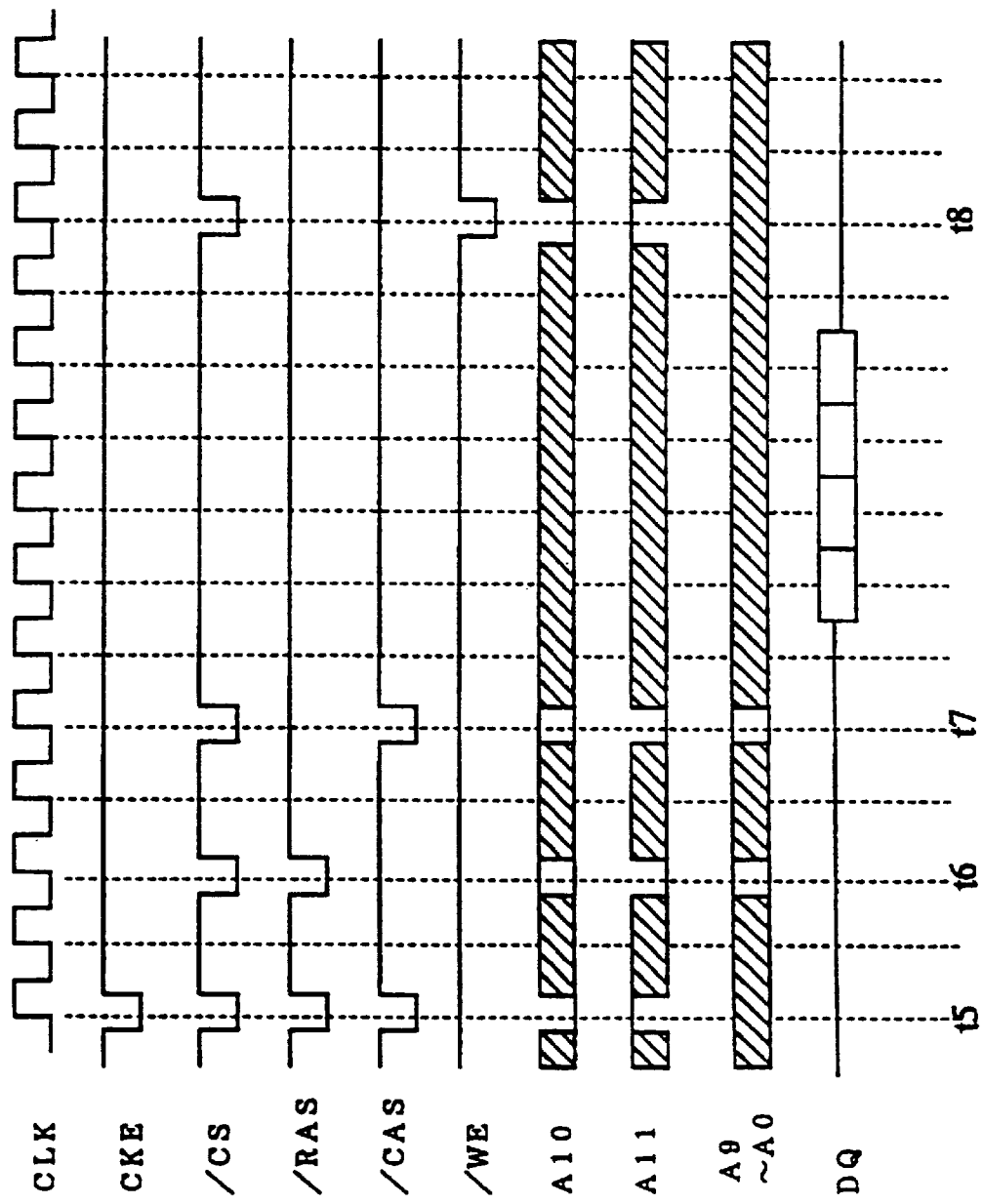
FIG. 6 is a timing chart for explaining still another example of self-refresh cycle of the SDRAM to which the invention is applied.
Figure 7:
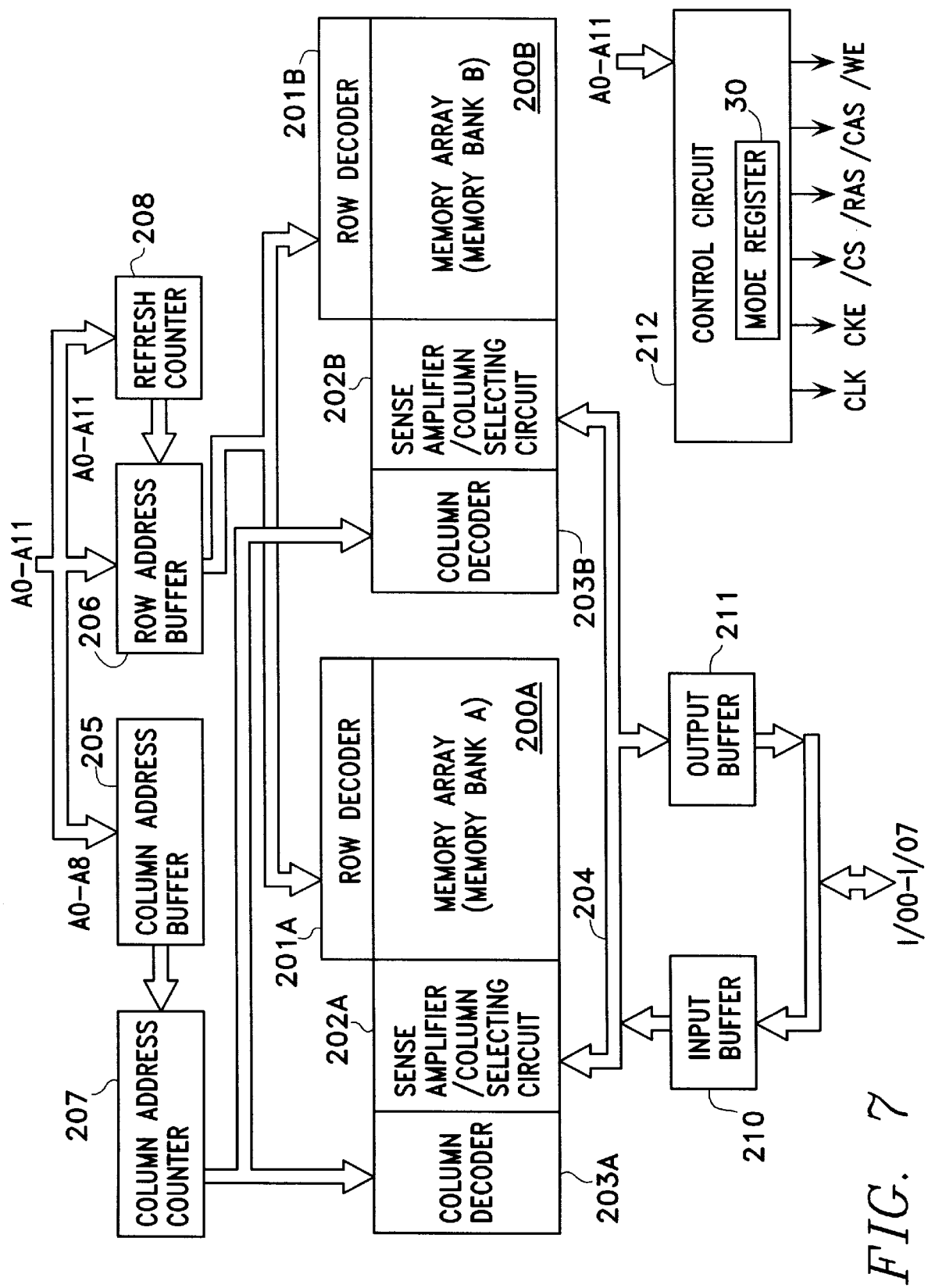
FIG. 7 is a block diagram showing a configuration example of a conventional SDRAM.
Figure 8:
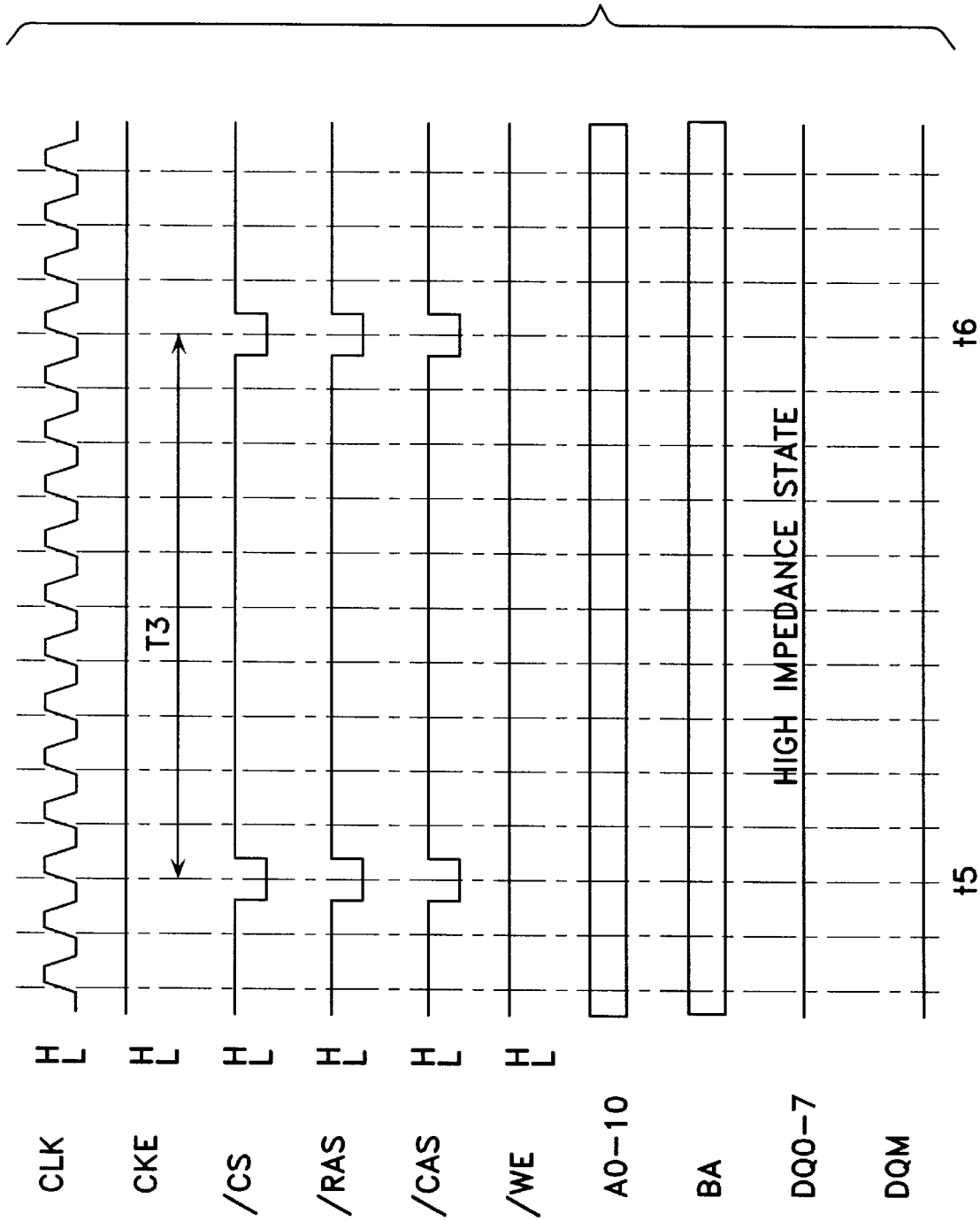
FIG. 8 is a timing chart for explaining one example of an auto-refresh cycle of the conventional SDRAM.
Figure 9:
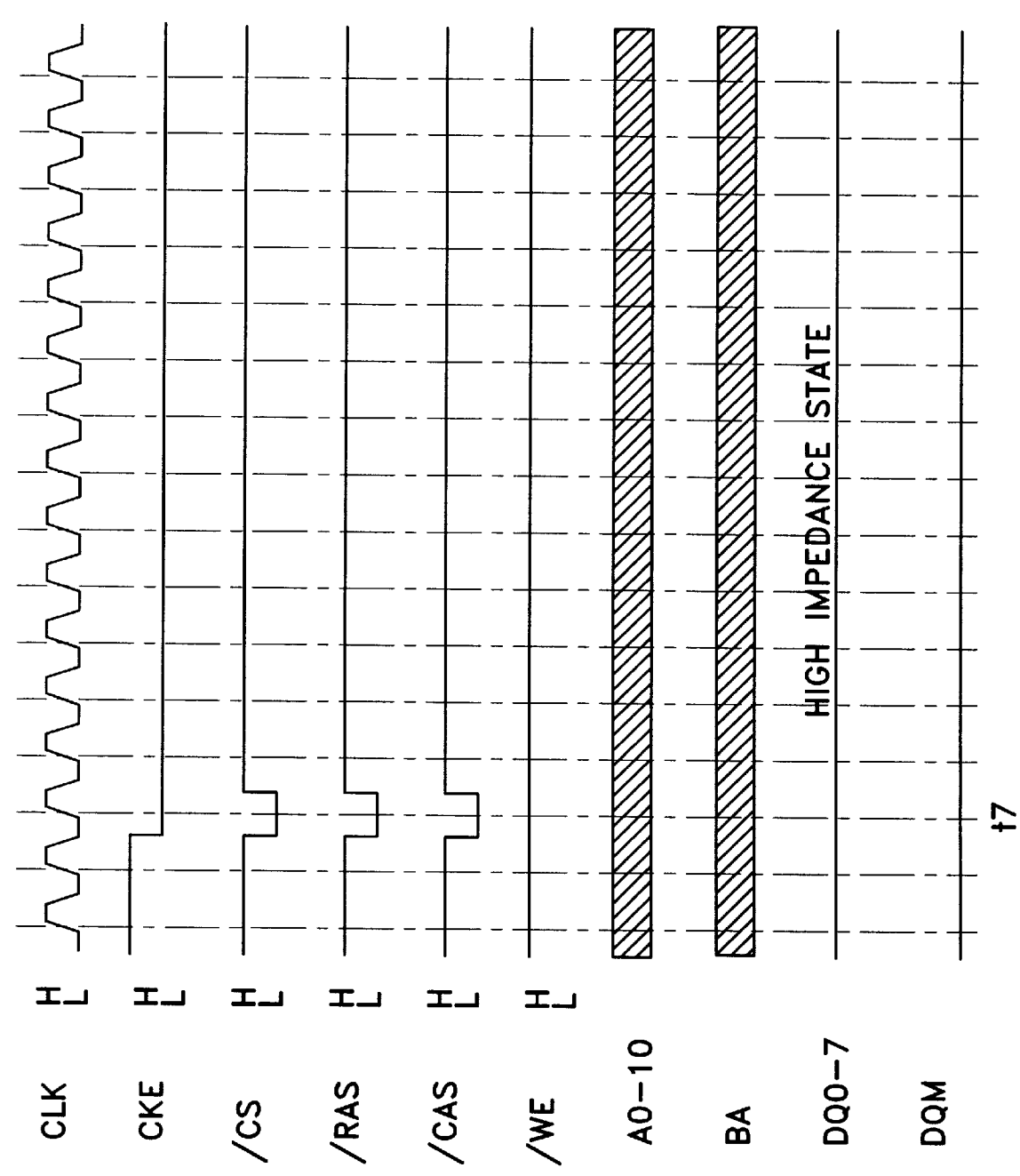
FIG. 9 is a timing chart for explaining one example of a self-refresh cycle of the conventional SDRAM.

At time t8 in FIG. 6, similarly with the burst stop command, the chip selecting signal /CS and the write enable signal /WE are set at low levels, the row address strobe signal /RAS, the column address strobe signal /CAS and the clock enable signal CKE are set at high levels, the terminal A10 is set at a low level, and the terminal A11 is set at a level showing the bank which is being self-refreshed. In FIG. 6, the terminal A11 is set at a high level so that the self-refresh of the bank B is terminated.

It is apparent that, though the invention is configured such that respective refresh actions (auto-refresh or self-refresh) are performed on the basis of the row address, the invention may be configured such that the similar refresh actions are performed on the basis of the column address.

Also, it is apparent that in the embodiment, the invention is implemented for a synchronous type semiconductor memory device having two memory banks, but the present invention can similarly be implemented for a synchronous type semiconductor memory device having at least three memory banks. Of course, in this case, at least two bits are required for memory bank designation. The invention can also be implemented with respect to semiconductor memories other than the synchronous type semiconductor memory device.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A semiconductor memory device comprising:
 a plurality of memory banks, memory access actions being allowed to be independently performed on the respective memory banks; and
 a refresh control circuit for allowing the plurality of memory banks to be refreshed in a lump and for allowing one or more memory banks of the plurality of memory banks designated to be refreshed,
 the semiconductor memory device being a dynamic random access memory,
 wherein when a specific input terminal is at a first level, the plurality of memory banks are refreshed in a lump, and when the specific input terminal is at a second level, one of the plurality of memory banks is designated to be refreshed in accordance with a bank selecting bit composed of one bit or a combination of a plurality of bits inputted from terminals other than the specific input terminal,
 wherein the semiconductor device is configured so that a memory bank address-storing mode register need not be referred to for at least one of the plurality of memory banks to be refreshed.

2. A semiconductor memory device comprising:
 a plurality of memory banks, memory access actions being allowed to be independently performed on the respective memory banks; and
 a refresh control circuit for allowing the plurality of memory banks to be refreshed in a lump and for allowing one or more memory banks of the plurality of memory banks designated to be refreshed,
 the semiconductor memory device being a dynamic random access memory,
 wherein when one of a row address input terminal and a specific input terminal other than the row address input terminal is at a high level, the plurality of memory banks are refreshed in a lump, and when one of the row address input terminal and the specific input terminal is at a low level, one of the plurality of memory banks is designated to be refreshed in accordance with a bank selecting bit composed of one bit or a combination of a plurality of bits of row addresses other than the row address, wherein the semiconductor device is configured so that a memory bank address-storing mode register need not be referred to for at least one of the plurality of memory banks to be refreshed.

3. The semiconductor memory device of claim 2, wherein synchronously with a rising of a clock signal CLK, a chip selecting signal /CS, a row address strobe signal /RAS and a column address strobe signal /CAS are set at low levels, and a write enable signal /WE and a clock enable signal CKE are set at high levels, so that a designation of a bank to be auto-refreshed is made possible by inputting an address signal at that time.

4. The semiconductor memory device of claim 2, wherein synchronously with a rising of a clock signal CLK, a chip selecting signal /CS, a row address strobe signal /RAS, a column address strobe signal /CAS, and a clock enable signal CKE are set at low levels, and a write enable signal /WE is set at a high level, so that a designation of a bank to be self-refreshed is made possible by inputting an address signal at that time.

5. The semiconductor memory device of claim 4, wherein synchronously with the rising of the clock signal CLK, the chip selecting signal /CS, the row address strobe signal /RAS and the write enable signal /WE are set at low levels, and the column address strobe signal /CAS and the clock enable signal CKE are set at high levels, so that a designation of a bank, the auto-refresh of which is to be terminated, is made possible by inputting an address signal at that time.

6. The semiconductor memory device of claim 4, wherein synchronously with the rising of the clock signal CLK, the chip selecting signal /CS, the row address strobe signal /RAS, the column address strobe signal /CAS, and the clock enable signal CKE are set at low levels, and the write enable signal /WE is set at a high level, so that a designation of a bank, the self-refresh of which is to be terminated, is made possible by inputting an address signal at that time.

7. The semiconductor memory device of claim 4, wherein synchronously with the rising of the clock signal CLK, the chip selecting signal /CS, the row address strobe signal /RAS, the column address strobe signal /CAS, the write enable signal /WE and the clock enable signal CKE are set at low levels, so that a designation of a bank, the self-refresh of which is to be terminated, is made possible by inputting an address signal at that time.

8. The semiconductor memory device of claim 4, wherein synchronously with the rising of the clock signal CLK, the chip selecting signal /CS and the write enable signal /WE are set at low levels and the row address strobe signal /RAS, the column address strobe signal /CAS and the clock enable signal CKE are set at high levels, so that a designation of a bank, the self-refresh of which is to be terminated, is made possible by inputting an address signal at that time.

9. The semiconductor memory device of claim 2, wherein during a memory bank being refreshed, a read action is performed on a column address in a bank which is not refreshed.

* * * * *